(12) United States Patent
Hori et al.

(10) Patent No.: US 12,191,245 B2
(45) Date of Patent: Jan. 7, 2025

(54) SEMICONDUCTOR DEVICE HAVING A CURVED PART IN THE PRINTED CIRCUIT BOARD

(71) Applicant: FUJI ELECTRIC CO., LTD., Kawasaki (JP)

(72) Inventors: Motohito Hori, Nagano (JP); Yoshinari Ikeda, Nagano (JP); Akio Toba, Tokyo (JP); Michio Tamate, Tokyo (JP); Ikuya Sato, Kanagawa (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 355 days.

(21) Appl. No.: 17/731,861

(22) Filed: Apr. 28, 2022

(65) Prior Publication Data

US 2022/0406690 A1    Dec. 22, 2022

(30) Foreign Application Priority Data

Jun. 16, 2021    (JP) .................................. 2021-100366

(51) Int. Cl.
*H01L 23/498* (2006.01)
*H01L 23/00* (2006.01)
*H01L 25/07* (2006.01)

(52) U.S. Cl.
CPC .... *H01L 23/4985* (2013.01); *H01L 23/49822* (2013.01); *H01L 23/49833* (2013.01); *H01L 24/16* (2013.01); *H01L 24/32* (2013.01); *H01L 24/73* (2013.01); *H01L 25/072* (2013.01); *H01L 2224/16225* (2013.01); *H01L 2224/32225* (2013.01); *H01L 2224/73253* (2013.01); *H01L 2924/182* (2013.01); *H01L 2924/30107* (2013.01)

(58) Field of Classification Search
CPC ..... H01L 2224/16225; H01L 23/49822; H01L 23/49833; H01L 23/4985
USPC ........................................................ 257/668
See application file for complete search history.

(56) References Cited

U.S. PATENT DOCUMENTS 9,196,572 B2   11/2015  Steger et al.
11,127,714 B2   9/2021  Nakamura
(Continued)

FOREIGN PATENT DOCUMENTS

JP    2010-157610 A    7/2010
JP    2021-19063 A     2/2021

*Primary Examiner* — Hoai V Pham

(57) ABSTRACT

A semiconductor device includes: an insulated circuit substrate including first and second conductive layers on a top surface side; a first semiconductor chip mounted on the first conductive layer; a second semiconductor chip mounted on the second conductive layer; a printed circuit board including a first lower-side wiring layer arranged to be opposed to the first semiconductor chip, and a second lower-side wiring layer arranged to be opposed to the second semiconductor chip, the printed circuit board being provided with a curved part curved toward the insulated circuit substrate; a first connection member arranged to connect the first semiconductor chip with the first lower-side wiring layer; a second connection member arranged to connect the second semiconductor chip with the second lower-side wiring layer; and a third connection member arranged to connect the first conductive layer with the second lower-side wiring layer at the curved part.

14 Claims, 12 Drawing Sheets

(56) References Cited

U.S. PATENT DOCUMENTS

2016/0135326 A1\* 5/2016 Kim .................... H05K 3/4084
361/728
2021/0020603 A1 1/2021 Nakamura \* cited by examiner

SEMICONDUCTOR DEVICE HAVING A CURVED PART IN THE PRINTED CIRCUIT BOARD

CROSS-REFERENCE TO RELATED APPLICATION

This application claims benefit of priority under 35 USC 119 based on Japanese Patent Application No. 2021-100366 filed on Jun. 16, 2021, the entire contents of which are incorporated by reference herein.

BACKGROUND

1. Field of the Invention

The present invention relates to a semiconductor device (a semiconductor module) equipped with a power semiconductor element inside the device.

2. Description of the Related Art

A power semiconductor element is known as a switching element for power conversion, for example. A semiconductor device equipped with such a power semiconductor element inside the device is known that has a structure in which power semiconductor chips (referred to simply below as "semiconductor chips") implementing the power semiconductor element are arranged on an insulated circuit substrate so that the semiconductor chips are bonded to the insulated circuit substrate and terminals via bonding wires.

JP2010-157610 A discloses a semiconductor device having a wiring structure in which a semiconductor LSI package is packaged on a mother board via solder balls. An integrated circuit (IC) is connected to a flexible substrate by flip-chip connection on a package substrate to be connected to the mother board by wiring so that the IC is connected to the package substrate via the flexible substrate.

JP2021-19063 A discloses a semiconductor device including an insulated circuit substrate, a plurality of semiconductor chips mounted on the insulated circuit substrate, and a printed circuit board arranged over the plural semiconductor chips so as to implement upper and lower arms for three-phases.

The conventional semiconductor devices have a problem of an increase in inductance in association with an increase in wire length and current path when the semiconductor chips are bonded to the insulated circuit substrate and the terminals via the bonding wires.

SUMMARY

In view of the foregoing problems, the present invention provides a semiconductor device having a configuration capable of decreasing a wire length and a current path so as to reduce an inductance.

An aspect of the present invention inheres in a semiconductor device including: an insulated circuit substrate including first and second conductive layers on a top surface side; a first semiconductor chip mounted on the first conductive layer; a second semiconductor chip mounted on the second conductive layer; a printed circuit board including a first lower-side wiring layer arranged so as to be opposed to the first semiconductor chip, and a second lower-side wiring layer arranged so as to be opposed to the second semiconductor chip, the printed circuit board being provided with a curved part curved toward the insulated circuit substrate; a first connection member arranged to connect the first semiconductor chip with the first lower-side wiring layer; a second connection member arranged to connect the second semiconductor chip with the second lower-side wiring layer; a third connection member arranged to connect the first conductive layer with the second lower-side wiring layer at the curved part; and a sealing member provided to seal the first and second semiconductor chips, the printed circuit board, and the first to third connection members.

DETAILED DESCRIPTION

Figure 1:
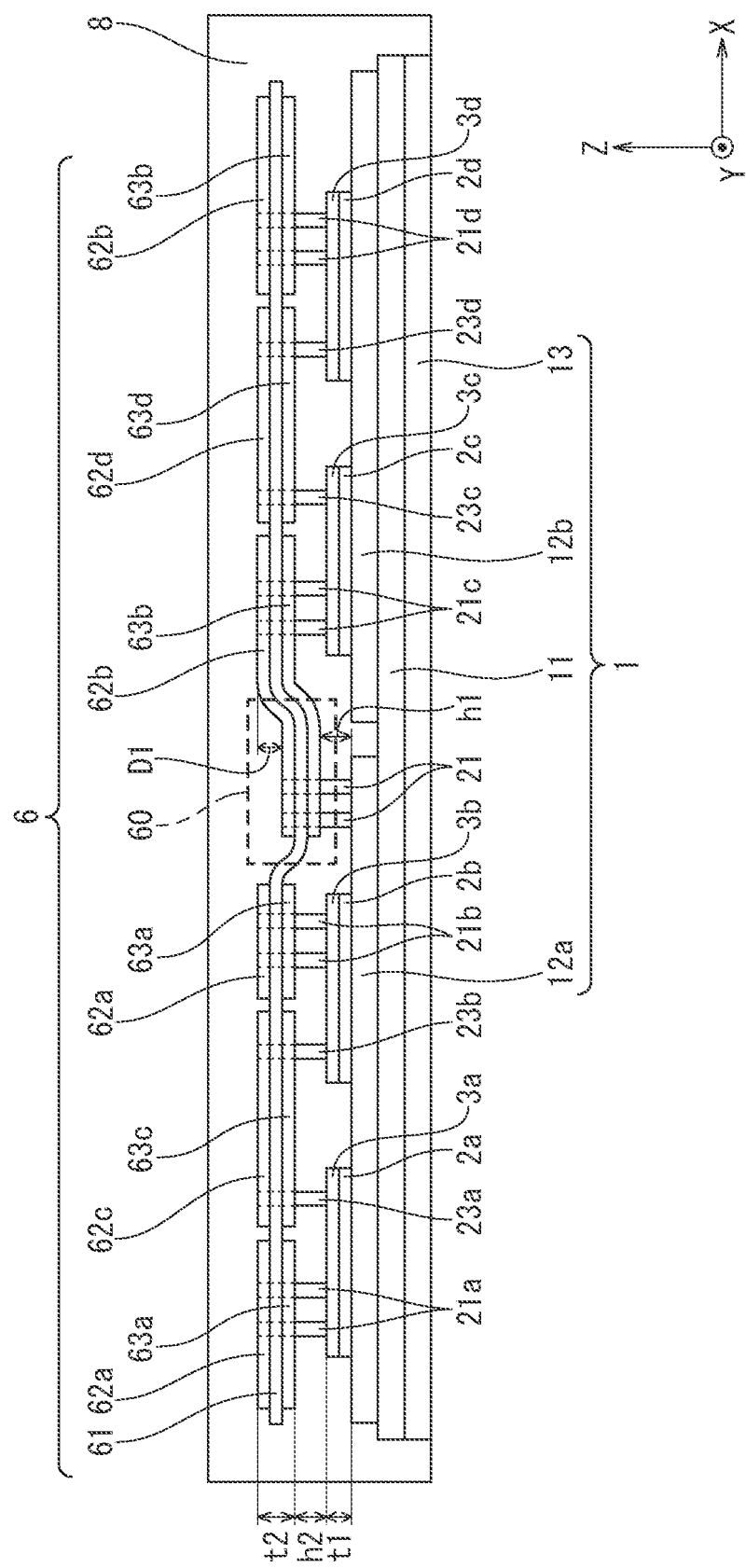
FIG. 1 is a side view illustrating a semiconductor device according to a first embodiment.

With reference to the Drawings, first to third embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Moreover, in some drawings, portions are illustrated with different dimensional relationships and proportions. The first to third embodiments described below merely illustrate schematically devices and methods for specifying and giving shapes to the technical idea of the present invention, and the span of the technical idea is not limited to materials, shapes, structures, and relative positions of elements described herein.

In the Specification, a "first main electrode" of a semiconductor chip is assigned to an electrode which will be a source electrode or a drain electrode in a field-effect transistor (FET) or a static induction transistor (SIT), an emitter electrode or a collector electrode in an insulated-gate bipolar transistor (IGBT) and an anode electrode or a cathode electrode in a static induction (SI) thyristor, a gate turn-off (GTO) thyristor or a diode.

A "second main electrode" of the semiconductor chip is assigned to an electrode which will not be the first main electrode and will be the source electrode or the drain electrode in the FET or the SIT, the emitter electrode or the collector electrode in the IGBT, and the anode electrode or the cathode electrode in the SI thyristor, the GTO thyristor or the diode.

That is, when the first main electrode is the source electrode, the second main electrode means the drain electrode. When the first main electrode is the emitter electrode, the second main electrode means the collector electrode. When the first main electrode is the anode electrode, the second main electrode means the cathode electrode. A "main electrode" of the semiconductor chip means the first main electrode or the second main electrode.

The terms regarding the directions such as "upper", "lower", "upper-lower", "left", "right", and "right-left" as described herein are definitions made only for illustration purposes, and it should be understood that these terms are not intended to limit the technical idea of the present invention. For example, the elements described as being on the "upper" and "lower" sides can be oriented on the "left" and "right" sides when turned over 90 degrees, and can be oriented on the opposite sides when turned over 180 degrees.

With regard to the three-dimensional spatial relation of the three directions perpendicular to each other described below, a first direction and a second direction perpendicular to each other on the same plane are defined as an X direction and a Y direction, and a third direction perpendicular to each of the first direction and the second direction is defined as a Z direction.

First Embodiment

<Configuration of Semiconductor Device>

A semiconductor device according to a first embodiment is a "2-in-1" semiconductor module having functions for two power semiconductor elements. As illustrated in FIG. 1, the semiconductor device according to the first embodiment includes an insulated circuit substrate 1, and a plurality of semiconductor chips 3a to 3d mounted on the insulated circuit substrate 1 via bonding materials 2a to 2d such as solder or sintered material.

A printed circuit board 6 is arranged separately over the respective semiconductor chips 3a to 3d. The printed circuit board 6 includes lower-side wiring layers 63a and 63c arranged to be opposed to the semiconductor chips 3a and 3b, and lower-side wiring layers 63b and 63d arranged to be opposed to the semiconductor chips 3c and 3d. The printed circuit board 6 includes a curved part 60 protruding toward the insulated circuit substrate 1 in the middle part of the printed circuit board 6 in the longitudinal direction (in the X-axis direction).

The semiconductor chips 3a to 3d are electrically connected to the printed circuit board 6 via connection members 21a to 21d and 23a to 23d. The connection members 21a and 21b connect the semiconductor chips 3a and 3b with the lower-side wiring layer 63a. The connection members 23a and 23b connect the semiconductor chips 3a and 3b with the lower-side wiring layer 63c. The connection members 21c and 21d connect the semiconductor chips 3c and 3d with the lower-side wiring layer 63b. The connection members 23c and 23d connect the semiconductor chips 3c and 3d with the lower-side wiring layer 63d. The connection members 21 connect an upper-side conductive layer 12a of the insulated circuit substrate 1 with the lower-side wiring layer 63b of the printed circuit board 6 at the curved part 60.

The circumferences of the respective semiconductor chips 3a to 3d and the printed circuit board 6 are sealed with a sealing member 8 so that the semiconductor chips 3a to 3d and the printed circuit board 6 are electrically insulated from the circumferential elements.

The insulated circuit substrate 1 includes an insulated substrate 11, upper-side conductive layers (conductive plates) 12a and 12b arranged on the top surface of the insulated substrate 11 (on the circuit surface side) that is one of the main surfaces of the insulated substrate 11, and a lower-side conductive layer (a heat-radiating plate) 13 arranged on the bottom surface of the insulated substrate 11 (on the coolant surface side) that is the other main surface of the insulated substrate 11.

The insulated substrate 11 is a resin substrate formed from resin such as epoxy resin. Forming the insulated substrate 11 by the resin substrate instead of a ceramic substrate enables the shape of the upper-side conductive layers 12a and 12b deposited on the insulated substrate 11 to be freely designed. The upper-side conductive layers 12a and 12b and the lower-side conductive layer 13 are each conductive foil formed from copper (Cu) or aluminum (Al), for example.

Figure 2:
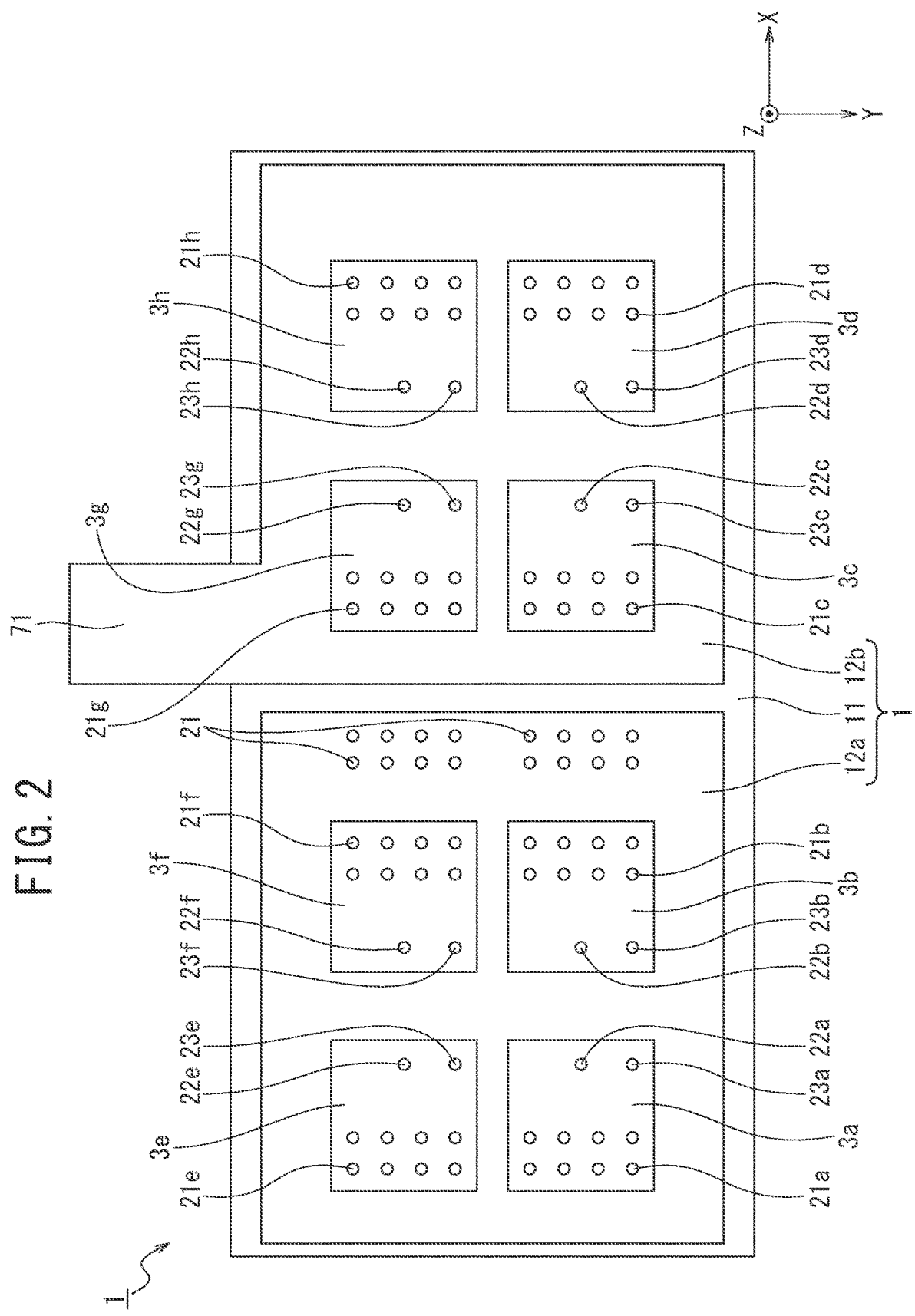
FIG. 2 is a plan view illustrating an insulated circuit substrate and semiconductor chips according to the first embodiment.

FIG. 2 is a plan view illustrating the insulated circuit substrate 1 and the respective semiconductor chips 3a to 3h as viewed from the top surface side. As illustrated in FIG. 2, the upper-side conductive layer 12a has a rectangular planar pattern. The upper-side conductive layer 12b has an L-shaped planar pattern. The upper-side conductive layer 12b is integrally provided with an external connection terminal (a drain-side connection terminal) 71 on the high-potential side. The drain-side connection terminal 71 projects from the insulated substrate 11 and further extends in the short-side direction of the insulated circuit substrate 1 (in the Y direction). The drain-side connection terminal 71 projects from the side surface of the sealing member 8 illustrated in FIG. 1 so as to be connected to an external circuit. The position of the drain-side connection terminal 71 formed integrally with the upper-side conductive layer 12b is not limited to the case as described above, and may be changed as appropriate. The drain-side connection terminal 71 may be bent into an L-shape so as to extend upward (in the Z-axis direction).

The insulated circuit substrate 1 may be a direct copper bonded (DCB) substrate or an active metal brazed (AMB) substrate, for example. The insulated substrate 11 may be a ceramic substrate formed from aluminum oxide ($Al_2O_3$), aluminum nitride (AlN), silicon nitride ($Si_3N_4$), or boron nitride (BN), for example. When the insulated substrate 11 is a ceramic substrate, the upper-side conductive layer 12b may be formed into a rectangular planar pattern so that the drain-side connection terminal 71 is connected onto the upper-side conductive layer 12b via a bonding material such as solder. The drain-side connection terminal 71 in this case can also be bent into an L-shape so as to extend upward (in the Z-axis direction).

As illustrated in FIG. 2, the four semiconductor chips 3a, 3b, 3e, and 3f implementing the lower arm are mounted on the upper-side conductive layer 12a. The four semiconductor chips 3c, 3d, 3g, and 3h implementing the upper arm are mounted on the upper-side conductive layer 12b. The number of the semiconductor chips 3a to 3h is not limited to the case as illustrated in this embodiment, and may be determined as appropriate depending on a rated current and the like. For example, the lower arm and the upper arm may each be implemented by a single semiconductor chip.

The semiconductor chips 3a to 3h may each be formed from silicon (Si) material, or formed from wide-bandgap semiconductor material such as silicon carbide (SiC), gallium nitride (GaN), and gallium oxide ($Ga_2O_3$), for example. The semiconductor chips 3a to 3h to be used may be a power semiconductor element such as a field-effect transistor (FET), an insulated gate bipolar transistor (IGBT), a static induction (SI) thyristor, and a gate turn-off (GTO) thyristor, or a rectifier element such as a freewheeling diode (FWD), while the type to be used can vary depending on the purpose. The present embodiment is illustrated below with a case in which the semiconductor chips 3a to 3h are a MOSFET of SiC.

The semiconductor chips 3a to 3h are each provided with a first main electrode (a drain electrode) on the bottom surface side, and provided with a control electrode (a gate electrode) and a second main electrode (a source electrode) on the top surface side. The respective drain electrodes of the semiconductor chips 3a, 3b, 3e, and 3f on the bottom surface side are bonded to the upper-side conductive layer 12a of the insulated circuit substrate 1 via the bonding materials 2a, 2b, and the like such as solder or sintered material. The respective drain electrodes of the semiconductor chips 3c, 3d, 3g, and 3h on the bottom surface side are bonded to the upper-side conductive layer 12b of the insulated circuit substrate 1 via the bonding materials 2c, 2d, and the like such as solder or sintered material.

The connection members 21a to 21h and 23a to 23h are bonded to the respective source electrodes of the semiconductor chips 3a to 3h via bonding materials such as solder or sintered material. The connection members 22a to 22h are bonded to the respective gate electrodes of the semiconductor chips 3a to 3h via bonding materials such as solder or sintered material.

The eight connection members 21a and the single connection member 23a are bonded to the source electrode of the semiconductor chip 3a. The single connection member 22a is bonded to the gate electrode of the semiconductor chip 3a. The eight connection members 21b and the single connection member 23b are bonded to the source electrode of the semiconductor chip 3b. The single connection member 22b is bonded to the gate electrode of the semiconductor chip 3b. The eight connection members 21c and the single connection member 23c are bonded to the source electrode of the semiconductor chip 3c. The single connection member 22c is bonded to the gate electrode of the semiconductor chip 3c. The eight connection members 21d and the single connection member 23d are bonded to the source electrode of the semiconductor chip 3d. The single connection member 22d is bonded to the gate electrode of the semiconductor chip 3d.

The eight connection members 21e and the single connection member 23e are bonded to the source electrode of the semiconductor chip 3e. The single connection member 22e is bonded to the gate electrode of the semiconductor chip 3e. The eight connection members 21f and the single connection member 23f are bonded to the source electrode of the semiconductor chip 3f. The single connection member 22f is bonded to the gate electrode of the semiconductor chip 3f. The eight connection members 21g and the single connection member 23g are bonded to the source electrode of the semiconductor chip 3g. The single connection member 22g is bonded to the gate electrode of the semiconductor chip 3g. The eight connection members 21h and the single connection member 23h are bonded to the source electrode of the semiconductor chip 3h. The single connection member 22h is bonded to the gate electrode of the semiconductor chip 3h.

The number of the respective connection members 21a to 21h, 22a to 22h, and 23a to 23h connected to the semiconductor chips 3a to 3h is not limited to the case as illustrated in this embodiment, and may be determined as appropriate.

The plural connection members 21 (two columns×eight rows) are bonded to the edge part on the upper-side conductive layer 12a adjacent to the upper-side conductive layer 12b in the insulated circuit substrate 1 via bonding materials such as solder or sintered material. The connection members 21 are located in the middle part of the insulated circuit substrate 1 in the longitudinal direction (in the X-axis direction). While the present embodiment is illustrated with the case in which the connection members 21 are arranged in the two columns in the short-side direction (in the Y-axis direction) of the insulated circuit substrate 1, the connection members 21 may be arranged in a single column. The number of the connection members 21 is not limited to the case as illustrated in this embodiment, and may be determined as appropriate.

The connection members 21, 21a to 21h, 22a to 22h, and 23a to 23h have the same configuration and the same length. The connection members 21, 21a to 21h, 22a to 22h, and 23a to 23h are pins formed from metal material such as copper (Cu), for example. The connection members 21, 21a to 21h, 22a to 22h, and 23a to 23h each have a stick-like shape or a pillar-shape shape, and more particularly, may have a columnar shape, a cylindroid shape, or a polygonal prism such as a triangular prism and a quadrangular prism. The connection members 21, 21a to 21h, 22a to 22h, and 23a to 23h may also be bumps or balls formed from metal material such as copper (Cu), or may be solder balls.

The present embodiment is illustrated below with a case in which the connection members 21, 21a to 21h, 22a to 22h, and 23a to 23h are inserted to penetration holes of the printed circuit board 6 so as to reach upper-side wiring layers 62a to 62d of the printed circuit board 6. FIG. 1 schematically indicates, by the broken lines, the parts in which the respective connection members 21, 21a to 21h, 22a to 22h, and 23a to 23h penetrate the printed circuit board 6. The connection members 21, 21a to 21h, 22a to 22h, and 23a to 23h may protrude upward from the upper-side wiring layers 62a to 62d of the printed circuit board 6.

When the connection members 21, 21a to 21h, 22a to 22h, and 23a to 23h are the bumps or the like, the connection members 21, 21a to 21h, 22a to 22h, and 23a to 23h may be bonded to lower-side wiring layers 63a to 63d of the printed circuit board 6 via bonding materials such as solder or sintered material without penetrating the printed circuit board 6. The upper-side wiring layers 62a to 62d and the lower-side wiring layers 63a to 63d in this case may be electrically connected to each other such that an insulating layer 61 of the printed circuit board 6 is provided with through-holes to be filled with via hole filling, for example.

Figure 3:
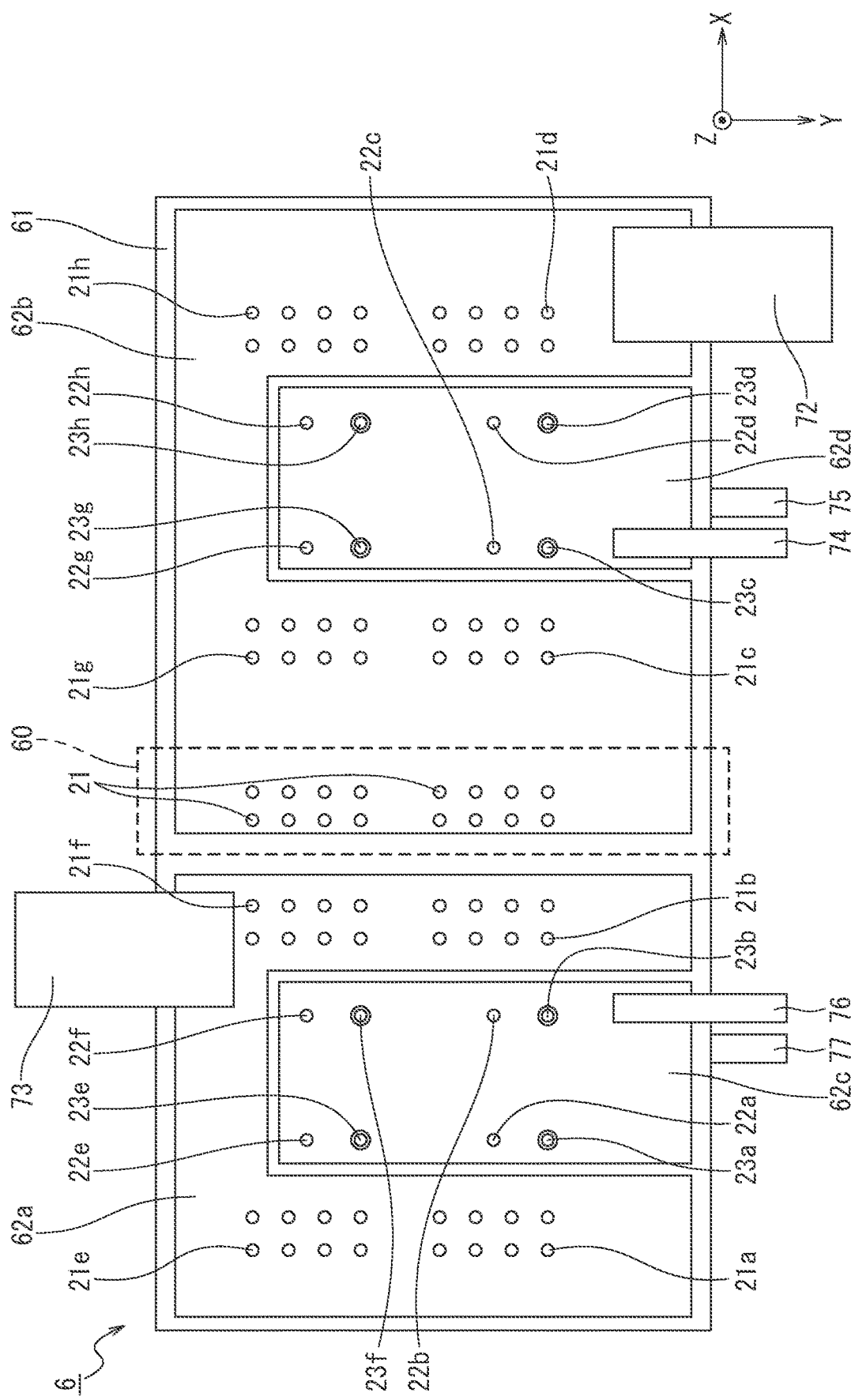
FIG. 3 is a plan view illustrating a printed circuit board according to the first embodiment as viewed from the top surface side.
Figure 4:
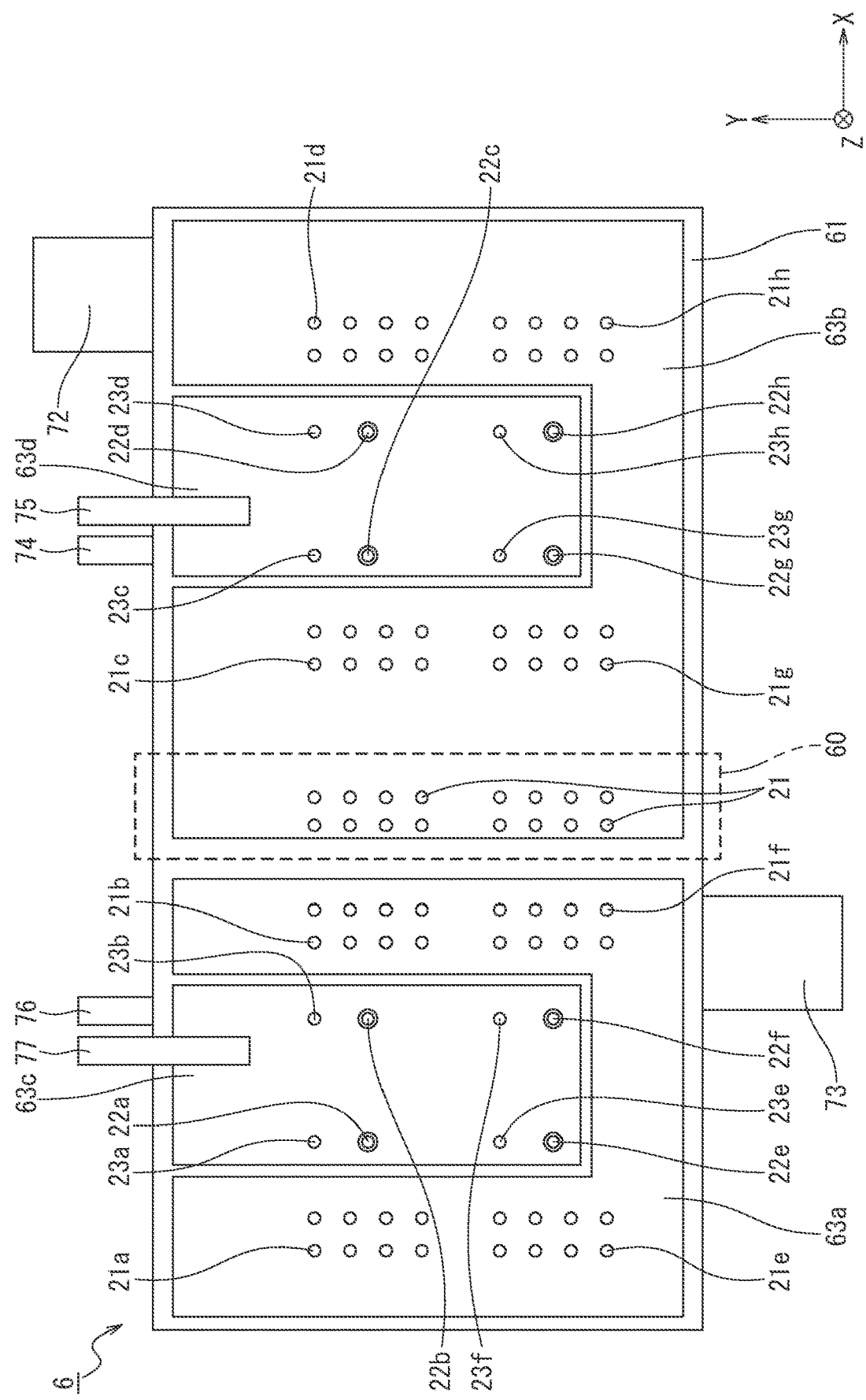
FIG. 4 is a plan view illustrating the printed circuit board according to the first embodiment as viewed from the bottom surface side.

The printed circuit board 6 illustrated in FIG. 1 is a flexible substrate (a laminated flexible substrate) having flexibility. FIG. 3 is a plan view of the printed circuit board 6 as viewed from the top surface side, and FIG. 4 is a plan view of the printed circuit board 6 as viewed from the bottom surface side. As illustrated in FIG. 1, FIG. 3, and FIG. 4, the printed circuit board 6 includes the insulating layer 61, the upper-side wiring layers 62a to 62d deposited on the top surface of the insulating layer 61, and the lower-side wiring layers 63a to 63d deposited on the bottom surface of the insulating layer 61. The insulating layer 61 is a resin film formed from resin such as polyimide, for example. The respective upper-side wiring layers 62a to 62d and the respective lower-side wiring layers 63a to 63d are conductive foil formed from copper (Cu) or aluminum (Al), for example.

The printed circuit board 6 is partly provided, in the middle in the longitudinal direction (in the X direction), with a curved part 60 convex toward the insulated circuit substrate 1. The curved part 60 includes a part of the insulating layer 61, a part of the upper-side wiring layer 62b, and a part of the lower-side wiring layer 63b.

A step D1 of the curved part 60 illustrated in FIG. 1 may have a thickness that is the same as the total thickness t1 of the respective bonding members 2a to 2d and the respective semiconductor chips 3a to 3d, for example. Since the distance between the printed circuit board 6 and the insulated circuit substrate 1 is decreased at the curved part 60, a height h1 of the connection member 21 connecting the upper-side conductive layer 12a of the insulated circuit substrate 1 with the lower-side wiring layer 63b of the curved part 60 of the printed circuit board 6 can be the same as a height h2 of the respective connection members 21a to 21h, 22a to 22h, and 23a to 23h connecting the semiconductor chips 3a to 3h with the lower-side wiring layers 63a to 63d. Since the connection members 21 and the connection members 21a to 21h, 22a to 22h, and 23a to 23h penetrate the printed circuit board 6 having a thickness t2, the length of the connection members 21 (h1+t2) is the same as the length of the connection members 21a to 21h, 22a to 22h, and 23a to 23h (h2+t2).

As illustrated in FIG. 3, the upper-side wiring layer 62a has a C-shaped planar pattern. The connection members 21a, 21b, 21e, and 21f are inserted and bonded to the penetration holes of the upper-side wiring layer 62a. The upper-side wiring layer 62a is electrically connected to the respective source electrodes of the semiconductor chips 3a, 3b, 3e, and 3f via the connection members 21a, 21b, 21e, and 21f.

One end of an external connection terminal (a source-side connection terminal) 73 on the low-potential side is bonded to the upper-side wiring layer 62a via a bonding material such as solder. The source-side connection terminal 73 is formed from metal material such as copper (Cu). The source-side connection terminal 73 projects from the printed circuit board 6 and further extends in the short-side direction of the printed circuit board 6 (in the Y-axis direction). The other end of the source-side connection terminal 73 projects on the side surface of the sealing member 8 illustrated in FIG. 1 to be connected to an external circuit. The source-side connection terminal 73 may be bent into an L-shape so as to extend upward (in the Z-axis direction). FIG. 1 omits the illustration of the source-side connection terminal 73.

As illustrated in FIG. 3, the upper-side wiring layer 62b is arranged separately from the upper-side wiring layer 62a, and has a C-shaped planar pattern. The connection members 21c, 21d, 21g, and 21h are inserted and bonded to the penetration holes of the upper-side wiring layer 62b. The upper-side wiring layer 62b is electrically connected to the respective source electrodes of the semiconductor chips 3c, 3d, 3g, and 3h via the connection members 21c, 21d, 21g, and 21h.

The connection members 21 are inserted and bonded to the penetration holes of the upper-side wiring layer 62b at the curved part 60 of the printed circuit board 6. The upper-side wiring layer 62b is electrically connected to the upper-side conductive layer 12a of the insulated circuit substrate 1 via the connection members 21.

One end of an external connection terminal (an output terminal) 72 on the output side is bonded to the upper-side wiring layer 62b via a bonding material such as solder. The output terminal 72 is formed from metal material such as copper (Cu). The output terminal 72 projects from the printed circuit board 6 and further extends in the short-side direction of the printed circuit board 6 (in the Y-axis direction) in the opposite direction of the source-side connection terminal 73. The other end of the output terminal 72 projects on the side surface of the sealing member 8 illustrated in FIG. 1 to be connected to an external circuit. The output terminal 72 may be bent into an L-shape so as to extend upward (in the Z-axis direction). FIG. 1 omits the illustration of the output terminal 72.

As illustrated in FIG. 3, the upper-side wiring layer 62c is arranged to be surrounded by the upper-side wiring layer 62a, and has a rectangular planar pattern. The connection members 22a, 22b, 22e, and 22f are inserted and bonded to the penetration holes of the upper-side wiring layer 62c. The upper-side wiring layer 62c is electrically connected to the respective gate electrodes of the semiconductor chips 3a, 3b, 3e, and 3f via the connection members 22a, 22b, 22e, and 22f. The connection members 23a, 23b, 23e, and 23f penetrate the other penetration holes of the upper-side wiring layer 62c, but are separated from the upper-side wiring layer 62c.

One end of a gate control terminal 76 is connected to the upper-side wiring layer 62c via a bonding material such as solder. The gate control terminal 76 projects from the printed circuit board 6 and further extends in the short-side direction of the printed circuit board 6 (in the Y-axis direction) in the same direction as the output terminal 72. The other end of the gate control terminal 76 projects on the side surface of the sealing member 8 illustrated in FIG. 1 to be connected to an external circuit. The gate control terminal 76 may be bent into an L-shape so as to extend upward (in the Z-axis direction). FIG. 1 omits the illustration of the gate control terminal 76.

The upper-side wiring layer 62d is arranged to be surrounded by the upper-side wiring layer 62b, and has a rectangular planar pattern. The connection members 22c, 22d, 22g, and 22h are inserted and bonded to the penetration holes of the upper-side wiring layer 62d. The upper-side wiring layer 62d is electrically connected to the respective gate electrodes of the semiconductor chips 3c, 3d, 3g, and 3h via the connection members 22c, 22d, 22g, and 22h. The connection members 23c, 23d, 23g, and 23h penetrate the other penetration holes of the upper-side wiring layer 62d, but are separated from the upper-side wiring layer 62d.

One end of a gate control terminal 74 is bonded to the upper-side wiring layer 62d via a bonding material such as solder. The gate control terminal 74 projects from the printed circuit board 6 and further extends in the short-side direction of the printed circuit board 6 (in the Y-axis direction) in the same direction as the gate control terminal 76 and the output terminal 72. The other end of the gate control terminal 74 projects on the side surface of the sealing member 8 illustrated in FIG. 1 to be connected to an external circuit. The gate control terminal 74 may be bent into an L-shape so as to extend upward (in the Z-axis direction). FIG. 1 omits the illustration of the gate control terminal 74.

As illustrated in FIG. 3 and FIG. 4, the respective upper-side wiring layers 62a to 62d and the respective lower-side wiring layers 63a to 63d have the similar circuit pattern so as to overlap with each other via the insulating layer 61, for example. As illustrated in FIG. 4, the lower-side wiring layer 63a is arranged to overlap with the upper-side wiring layer 62a via the insulating layer 61, and has a C-shaped planar pattern. The connection members 21a, 21b, 21e, and 21f are inserted and bonded to the penetration holes of the lower-side wiring layer 63a. The lower-side wiring layer 63a is electrically connected to the respective source electrodes of the semiconductor chips 3a, 3b, 3e, and 3f and the upper-side wiring layer 62a via the connection members 21a, 21b, 21e, and 21f. The source-side connection terminal 73 may be bonded to the lower-side wiring layer 63a, instead of being bonded to the upper-side wiring layer 62a.

The lower-side wiring layer 63b is arranged to overlap with the upper-side wiring layer 62b via the insulating layer 61. The lower-side wiring layer 63b is separated from the upper-side wiring layer 62a, and has a C-shaped planar pattern. The connection members 21c, 21d, 21g, and 21h are inserted and bonded to the penetration holes of the lower-side wiring layer 63b. The lower-side wiring layer 63b is electrically connected to the respective source electrodes of the semiconductor chips 3c, 3d, 3g, and 3h and the upper-side wiring layer 62b via the connection members 21c, 21d, 21g, and 21h.

The connection members 21 are inserted and bonded to the penetration holes of the lower-side wiring layer 63b at the curved part 60 of the printed circuit board 6. The lower-side wiring layer 63b is electrically connected to the upper-side conductive layer 12a of the insulated circuit substrate 1 and the upper-side wiring layer 62b via the connection members 21. The output terminal 72 may be bonded to the lower-side wiring layer 63b, instead of being bonded to the upper-side wiring layer 62b.

The lower-side wiring layer 63c is arranged to overlap with the upper-side wiring layer 62c via the insulating layer 61. The lower-side wiring layer 63c is arranged to be surrounded by the lower-side wiring layer 63a, and has a rectangular planar pattern. The connection members 23a, 23b, 23e, and 23f are inserted and bonded to the penetration holes of the lower-side wiring layer 63c. The lower-side wiring layer 63c is electrically connected to the respective source electrodes of the semiconductor chips 3a, 3b, 3e, and 3f via the connection members 23a, 23b, 23e, and 23f. The connection members 22a, 22b, 22e, and 22f penetrate the other penetration holes of the lower-side wiring layer 63c, but are separated from the lower-side wiring layer 63c.

One end of an auxiliary source terminal (a sense terminal) 77 serving as an external connection terminal for control is connected to the lower-side wiring layer 63c via a bonding material such as solder. The auxiliary source terminal 77 projects from the printed circuit board 6 and further extends in the short-side direction of the printed circuit board 6 (in the Y-axis direction) in the same direction as the respective gate control terminals 74 and 76 and the output terminal 72. The other end of the auxiliary source terminal 77 projects on the side surface of the sealing member 8 illustrated in FIG. 1 to be connected to an external circuit. The auxiliary source terminal 77 may be bent into an L-shape so as to extend upward (in the Z-axis direction). FIG. 1 omits the illustration of the auxiliary source terminal 77.

The lower-side wiring layer 63d is arranged to overlap with the upper-side wiring layer 62d via the insulating layer 61. The lower-side wiring layer 63d is arranged to be surrounded by the lower-side wiring layer 63b, and has a rectangular planar pattern. The connection members 23c, 23d, 23g, and 23h are inserted and bonded to the penetration holes of the lower-side wiring layer 63d. The lower-side wiring layer 63d is electrically connected to the respective source electrodes of the semiconductor chips 3c, 3d, 3g, and 3h via the connection members 23c, 23d, 23g, and 23h. The connection members 22c, 22d, 22g, and 22h penetrate the other penetration holes of the lower-side wiring layer 63d, but are separated from the lower-side wiring layer 63d.

One end of an auxiliary source terminal (a sense terminal) 75 serving as an external connection terminal for control is connected to the lower-side wiring layer 63d via a bonding material such as solder. The auxiliary source terminal 75 projects from the printed circuit board 6 and further extends in the short-side direction of the printed circuit board 6 (in the Y-axis direction) in the same direction as the respective gate control terminals 74 and 76, the output terminal 72, and the auxiliary source terminal 77. The other end of the auxiliary source terminal 75 projects on the side surface of the sealing member 8 illustrated in FIG. 1 to be connected to an external circuit. The auxiliary source terminal 75 may be bent into an L-shape so as to extend upward (in the Z-axis direction). FIG. 1 omits the illustration of the auxiliary source terminal 75.

The sealing member 8 illustrated in FIG. 1 serves as a casing of the semiconductor device according to the first embodiment, and has a substantially cuboidal shape. The insulated circuit substrate 1 is exposed on the bottom surface of the sealing member 8. A material used for the sealing member 8 can be a resin material such as thermosetting resin that is hard and has high heat resistance, and in particular, can be epoxy resin, maleimide resin, and cyanate resin.

Figure 5:
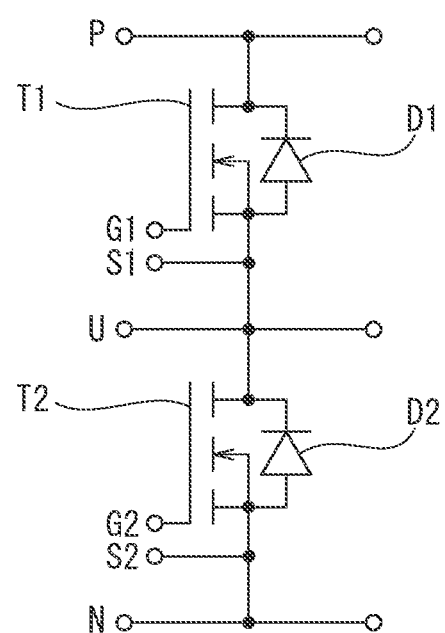
FIG. 5 is an equivalent circuit diagram of the semiconductor device according to the first embodiment.
Figure 6:
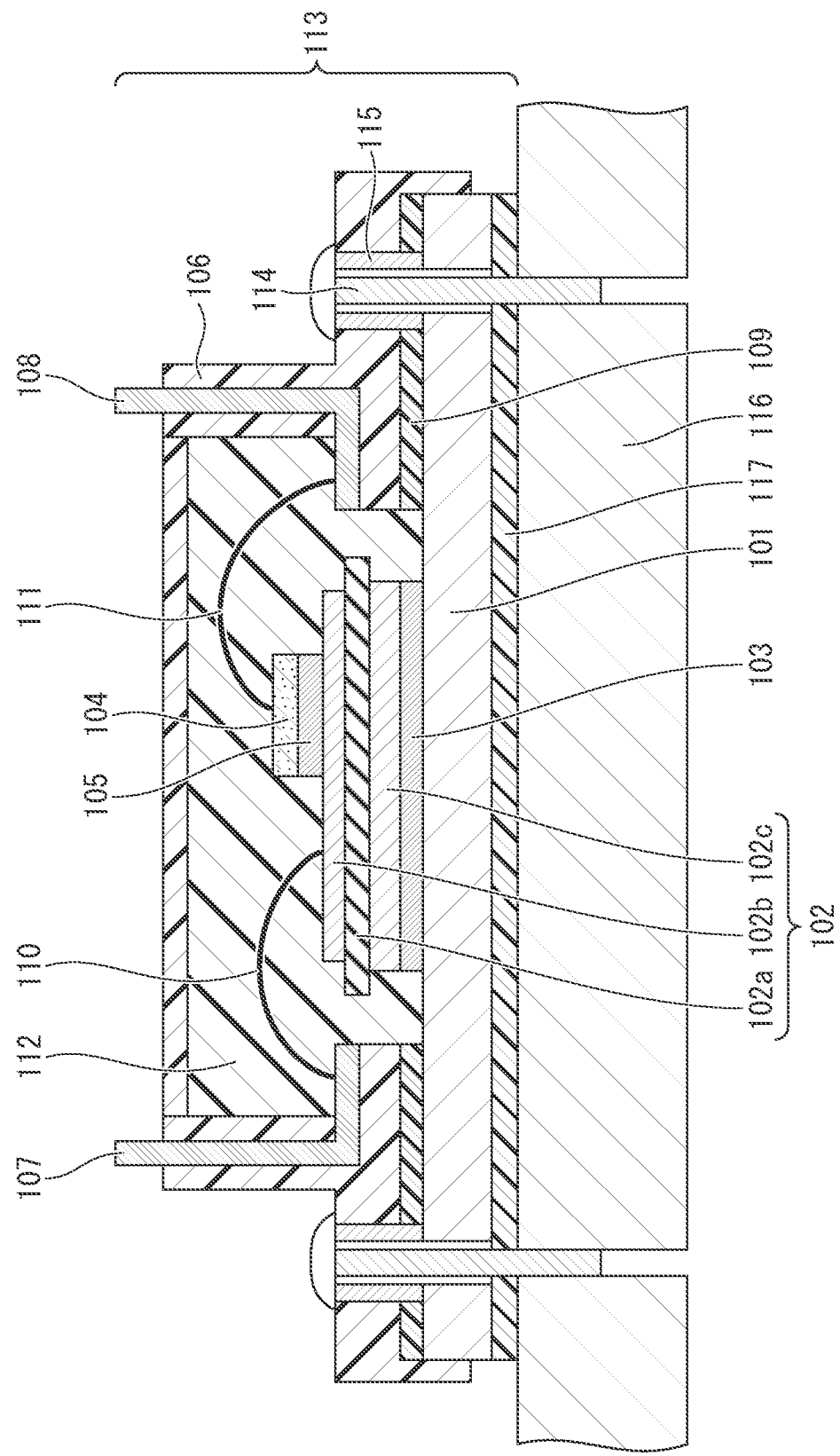
FIG. 6 is a cross-sectional view illustrating a semiconductor device of a comparative example.

FIG. 5 illustrates an example of an equivalent circuit diagram of the semiconductor device according to the first embodiment. As illustrated in FIG. 5, the semiconductor device according to the first embodiment implements a part of a three-phase bridge circuit. A second main electrode (a drain electrode) of a transistor T1 on the upper arm side is connected to a drain-side connection terminal P, and a first main electrode (a source electrode) of a transistor T2 on the lower arm side is connected to a source-side connection terminal N. A source electrode of the transistor T1 and a drain electrode of the transistor T2 are connected to an output terminal U and an auxiliary source terminal S1. An auxiliary source terminal S2 is connected to the source electrode of the transistor T2. Gate control terminals G1 and G2 are connected to gate electrodes of the transistors T1 and T2 respectively. Body diodes D1 and D2 serving as freewheeling diodes (FWDs) are connected in antiparallel to and installed in the transistors T1 and T2.

The drain-side connection terminal P illustrated in FIG. 5 corresponds to the drain-side connection terminal 71 illustrated in FIG. 2, and the source-side connection terminal N and the output terminal U illustrated in FIG. 5 correspond to the source-side connection terminal 73 and the output terminal 72 illustrated in FIG. 2. The transistor T1 illustrated in FIG. 5 corresponds to the semiconductor chips 3c, 3d, 3g, and 3h illustrated in FIG. 1, and the transistor T2 illustrated in FIG. 5 corresponds to the semiconductor chips 3a, 3b, 3e, and 3f. The gate control terminals G1 and G2 illustrated in FIG. 5 correspond to the gate control terminals 74 and 76, and the auxiliary source terminals S1 and S2 illustrated in FIG. 5 correspond to the auxiliary source terminals 75 and 77 illustrated in FIG. 3

<Operations of Semiconductor Device>

The operations of the semiconductor device according to the first embodiment are described below with reference to FIG. 1 to FIG. 4. A control signal output from the gate control terminal 76 illustrated in FIG. 3 is applied to the respective gate electrodes of the semiconductor chips 3a, 3b, 3e, and 3f implementing the lower arm via the upper-side wiring layer 62c and the connection members 22a, 22b, 22e, and 22f. A control signal output from the gate control terminal 74 is applied to the respective gate electrodes of the semiconductor chips 3c, 3d, 3g, and 3h implementing the upper arm via the upper-side wiring layer 62d and the connection members 22c, 22d, 22g, and 22h. The semiconductor chips 3a, 3b, 3e, and 3f and the semiconductor chips 3c, 3d, 3g, and 3h are alternately subjected to a switching operation in accordance with the control signals applied.

A current entering through the drain-side connection terminal 71 illustrated in FIG. 2 flows into the respective drain electrodes of the semiconductor chips 3c, 3d, 3g, and 3h on the upper arm side via the upper-side conductive layer 12b of the insulated circuit substrate 1. The current flowing through the respective source electrodes of the semiconductor chips 3c, 3d, 3g, and 3h flows into the external circuit via the output terminal 72 through the connection members 21c, 21d, 21g, and 21h, and the upper-side wiring layer 62b and the lower-side wiring layer 63b of the printed circuit board 6 illustrated in FIG. 3.

A current entering the output terminal 72 from the external circuit is supplied to the respective drain electrodes of the semiconductor chips 3a, 3b, 3e, and 3f on the lower arm side via the upper-side wiring layer 62b and the lower-side wiring layer 63b of the printed circuit board 6, the connection members 21, and the upper-side conductive layer 12a of the insulated circuit substrate 1. The current flowing through the respective source electrodes of the semiconductor chips 3a, 3b, 3e, and 3f flows into the external circuit via the source-side connection terminal 73 through the connection members 21a, 21b, 21e, and 21f, and the upper-side wiring layer 62a and the lower-side wiring layer 63a of the printed circuit board 6.

The current on the source electrode side of the semiconductor chips 3a, 3b, 3e, and 3f is detected by the external circuit via the connection members 23a, 23b, 23e, and 23f, the lower-side wiring layer 63c of the printed circuit board 6, and the auxiliary source terminal 77. The current on the source electrode side of the semiconductor chips 3c, 3d, 3g, and 3h is detected by the external circuit via connection members 23c, 23d, 23g, and 23h, the lower-side wiring layer 63d of the printed circuit board 6, and the auxiliary source terminal 75.

Comparative Example

A semiconductor device (a power semiconductor module) of a comparative example is described below. The power semiconductor module 113 of the comparative example includes a metal base plate 101 for heat radiation, an insulated circuit substrate 102 mounted on the metal base plate 101 via a solder 103, and a semiconductor chip 104 mounted on the insulated circuit substrate 102 via a solder 105. The insulated circuit substrate 102 includes a ceramic substrate 102a, and copper plates 102b and 102c bonded to the top and bottom surfaces of the ceramic substrate 102a.

The insulated circuit substrate 102 and the metal base plate 101 are housed in a resin case 106. Terminals 107 and 108 are arranged in the resin case 106. The semiconductor chip 104 is bonded to the terminals 107 and 108 and the insulated circuit substrate 102 via bonding wires 110 and 111. The side surface of the resin case 106 and the respective top surfaces of the metal base plate 101 and the insulated circuit substrate 102 define a space surrounding the semiconductor chip 104 and filled with a sealing member 112. This ensures the insulation between the semiconductor chip 104, the insulated circuit substrate 102, the metal base plate 101, and the respective terminals 107 and 108.

The power semiconductor module 113 of the comparative example is attached to a cooling member 116 with screws 114 provided at two or four parts at both edges of the metal base plate 101 via rings 115, so that heat is released via a heat radiation grease 117.

The power semiconductor module 113 of the comparative example needs to use the long wires and current paths, since the semiconductor chip 104 is bonded to the insulated circuit substrate 102 and the terminals 107 and 108 via the bonding wires 110 and 111, which increase an inductance of the main circuit. In contrast, in the semiconductor device according to the first embodiment, the printed circuit board 6 is curved to be connected to the insulated circuit substrate 1 by use of the connection members 21, so as to decrease the wiring length, reducing the inductance of the main circuit accordingly. In addition, since the semiconductor device according to the first embodiment does not need to use a relay area such as a bonding wire, a reduction in size of the semiconductor module can be achieved.

<Method of Manufacturing Semiconductor Device>

Figure 7:
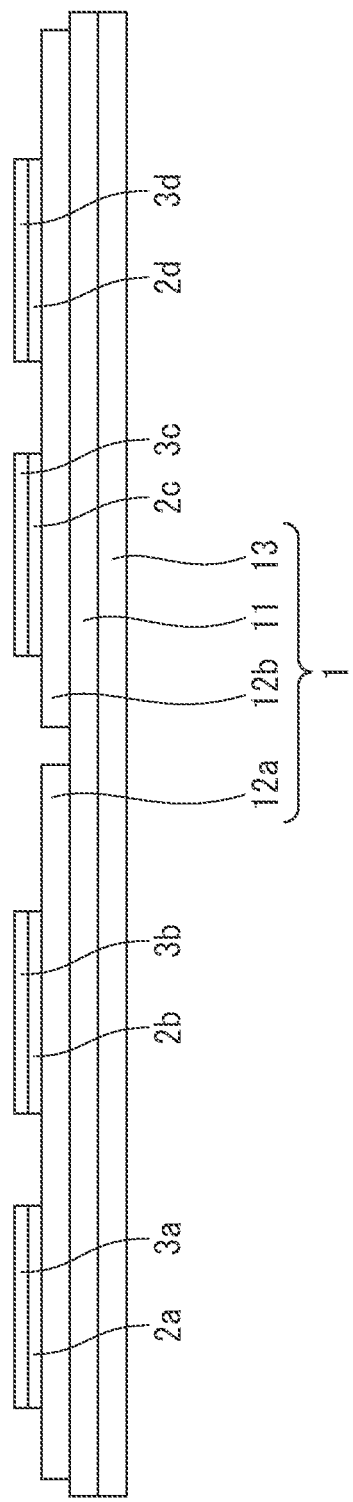
FIG. 7 is a side view for explaining a method of manufacturing the semiconductor device according to the first embodiment.

An example of a method of manufacturing (a method of assembling) the semiconductor device according to the first embodiment is described below with reference to FIG. 7 to FIG. 9. As illustrated in FIG. 7, the insulated circuit substrate 1 is prepared first, and the semiconductor chips 3a to 3d are then mounted on the upper-side conductive layers 12a and 12b of the insulated circuit substrate 1 via the bonding materials 2a to 2d. The semiconductor chips 3e to 3h illustrated in FIG. 2 are also mounted on the upper-side conductive layers 12a and 12b of the insulated circuit substrate 1 at this point. The insulated substrate 11 of the insulated circuit substrate 1 is a resin substrate in this case, and the drain-side connection terminal 71 illustrated in FIG. 2 is formed integrally with the upper-side conductive layer 12b of the insulated circuit substrate 1.

Figure 8:
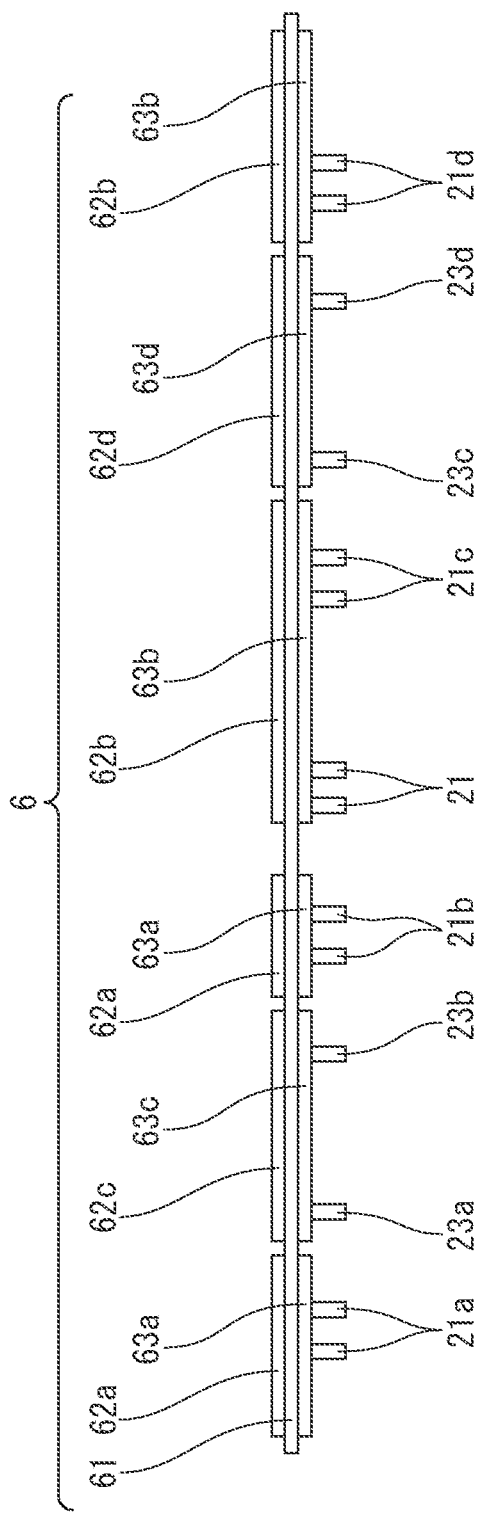
FIG. 8 is a side view continued from FIG. 7 for explaining the method of manufacturing the semiconductor device according to the first embodiment.
Figure 9:
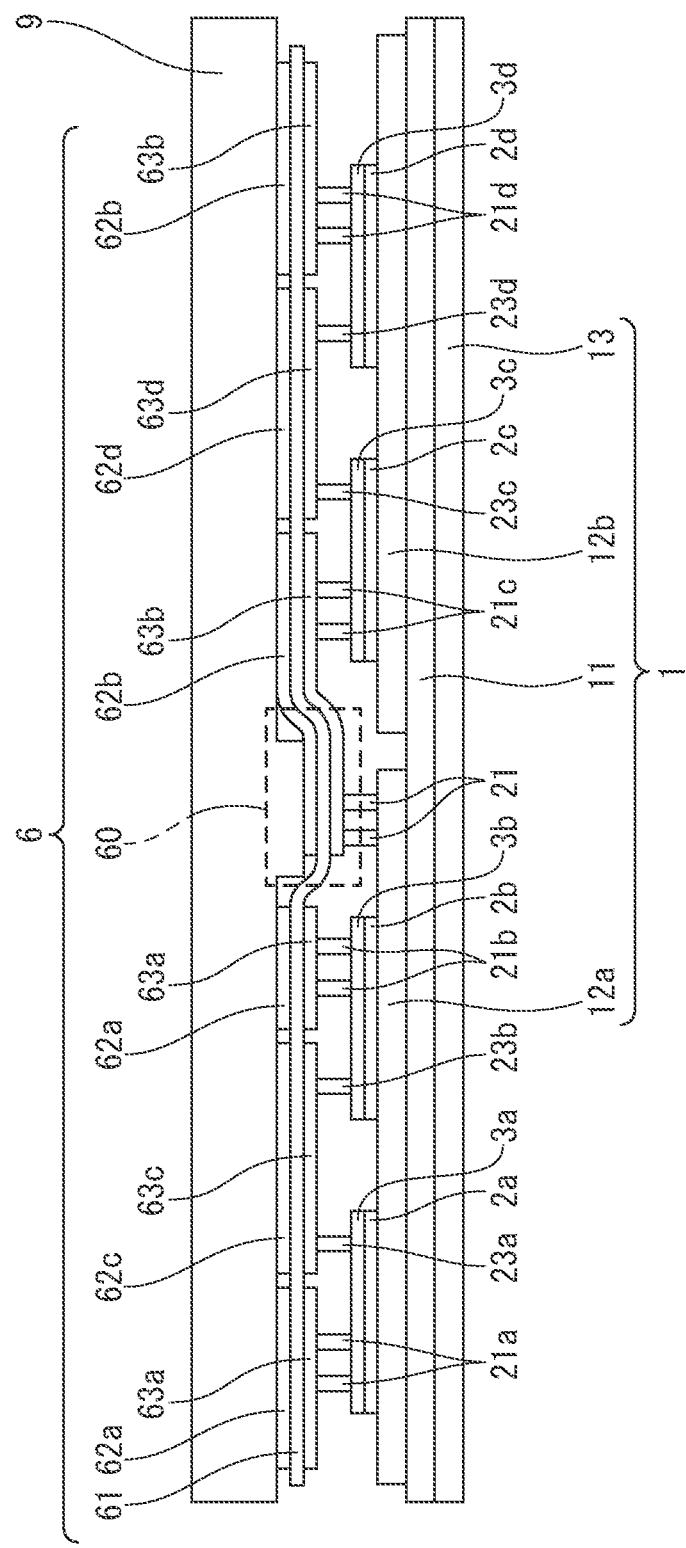
FIG. 9 is a side view continued from FIG. 8 for explaining the method of manufacturing the semiconductor device according to the first embodiment.

Next, as illustrated in FIG. 8, the printed circuit board 6 that is a flat flexible substrate is prepared, and the connection members 21, 21a, 23a, 21b, 23b, 21c, 23c, 21d, and 23d are then inserted to the printed circuit board 6 so as to form an implant substrate. The connection members 21e to 21h, 22a to 22h, and 23e to 23h illustrated in FIG. 3 and FIG. 4 are also inserted to the printed circuit board 6 at this point. The output terminal 72 and the source-side connection terminal 73 illustrated in FIG. 3 and FIG. 4 are then bonded to the printed circuit board 6.

Next, the implant substrate illustrated in FIG. 8 is mounted on the upper-side conductive layers 12a and 12b of the insulated circuit substrate 1 illustrated in FIG. 7 via the bonding materials 2a to 2d and the like. Subsequently, as illustrated in FIG. 9, a pressure is applied to the middle part of the printed circuit board 6 by use of a jig 9 made of a carbon, for example, so as to form the curved part 60.

Next, the insulated circuit substrate 1 and the semiconductor chips 3a to 3h, and the semiconductor chips 3a to 3h and the connection members 21, 21a to 21h, 22a to 22h, and 23a to 23h are bonded to each other by heat treatment. The semiconductor chips 3a to 3d, the connection members 21, 21a to 21h, 22a to 22h, and 23a to 23h, and the printed circuit board 6 are then sealed with the sealing member 8, so as to complete the semiconductor device according to the first embodiment as illustrated in FIG. 1.

Advantageous Effects

As described above, the semiconductor device according to the first embodiment takes advantage of the flexibility of the flexible substrate to lead the printed circuit board 6 to be curved for the connection in the middle part of the half bridge composed of the semiconductor chips 3a to 3h, so as to conductively connect the insulated circuit substrate 1 and the printed circuit board 6 to each other via the connection members 21. This configuration can decrease the wiring length, as compared with the conventional case of using the flat printed circuit board to ensure the wire connection or pin connection, so as to reduce the inductance of the main circuit accordingly. In addition, since the semiconductor device according to the first embodiment does not need to use a relay area such as a bonding wire, a reduction in size of the semiconductor module can be achieved.

The semiconductor device according to the first embodiment can also have the configuration in which the height h1 of the connection members 21 connecting the insulated circuit substrate 1 with the printed circuit board 6 is the same as the height h2 of the connection members 21a to 21h, 22a to 22h, and 23a to 23h connecting the semiconductor chips 3a to 3h with the printed circuit board 6 at the positions excluding the curved part 60. This can lead the length (h1+t2) of the connection members 21 to be the same as the length (h2+t2) of the connection members 21a to 21h, 22a to 22h, and 23a to 23h, so as to use the same components. The semiconductor device according to the first embodiment thus does not need to additionally use conventional metallic block members for height adjustment or pin terminals having different lengths, so as to decrease the number of components to be used and the number of steps to be performed.

In addition, the resin substrate is used as the insulated substrate 11 of the insulated circuit substrate 1, and the drain-side connection terminal 71 is formed integrally with the upper-side conductive layer 12b on the insulated substrate 11, so as to contribute to the decrease in the number of the components and the decrease in the number of the process of connecting the drain-side connection terminal 71 to the insulated circuit substrate 1.

In addition, the upper-side wiring layers 62c and 62d connected to the gate control terminals 74 and 76 of the printed circuit board 6 and the lower-side wiring layers 63c and 63d connected to the auxiliary source terminals 75 and 77 of the printed circuit board 6 have the same planar pattern via the insulating layer 61 so as to have the inverted current paths, reducing the inductance accordingly.

Second Embodiment

Figure 10:
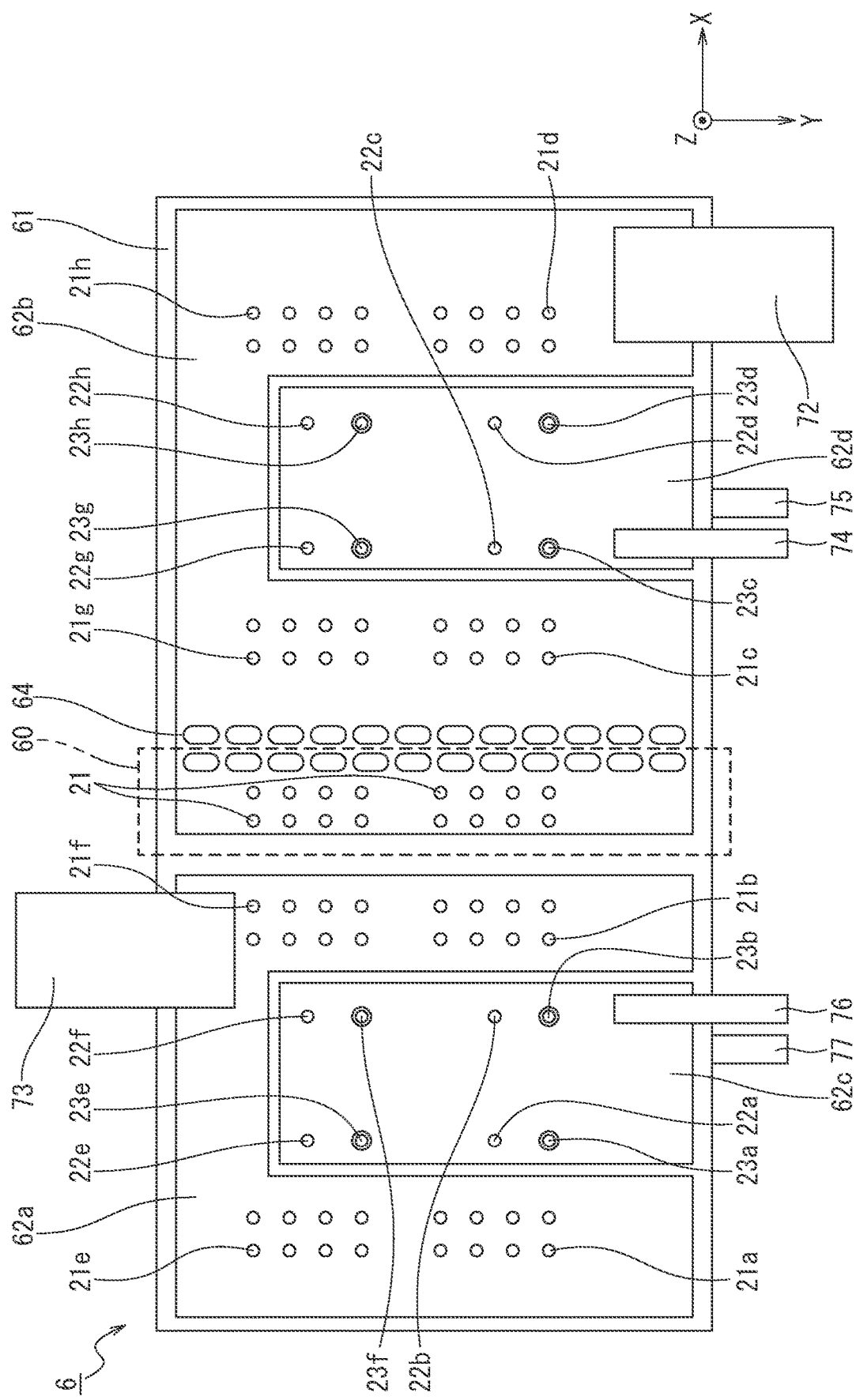
FIG. 10 is a plan view illustrating a printed circuit board according to a second embodiment as viewed from the top surface side.
Figure 11:
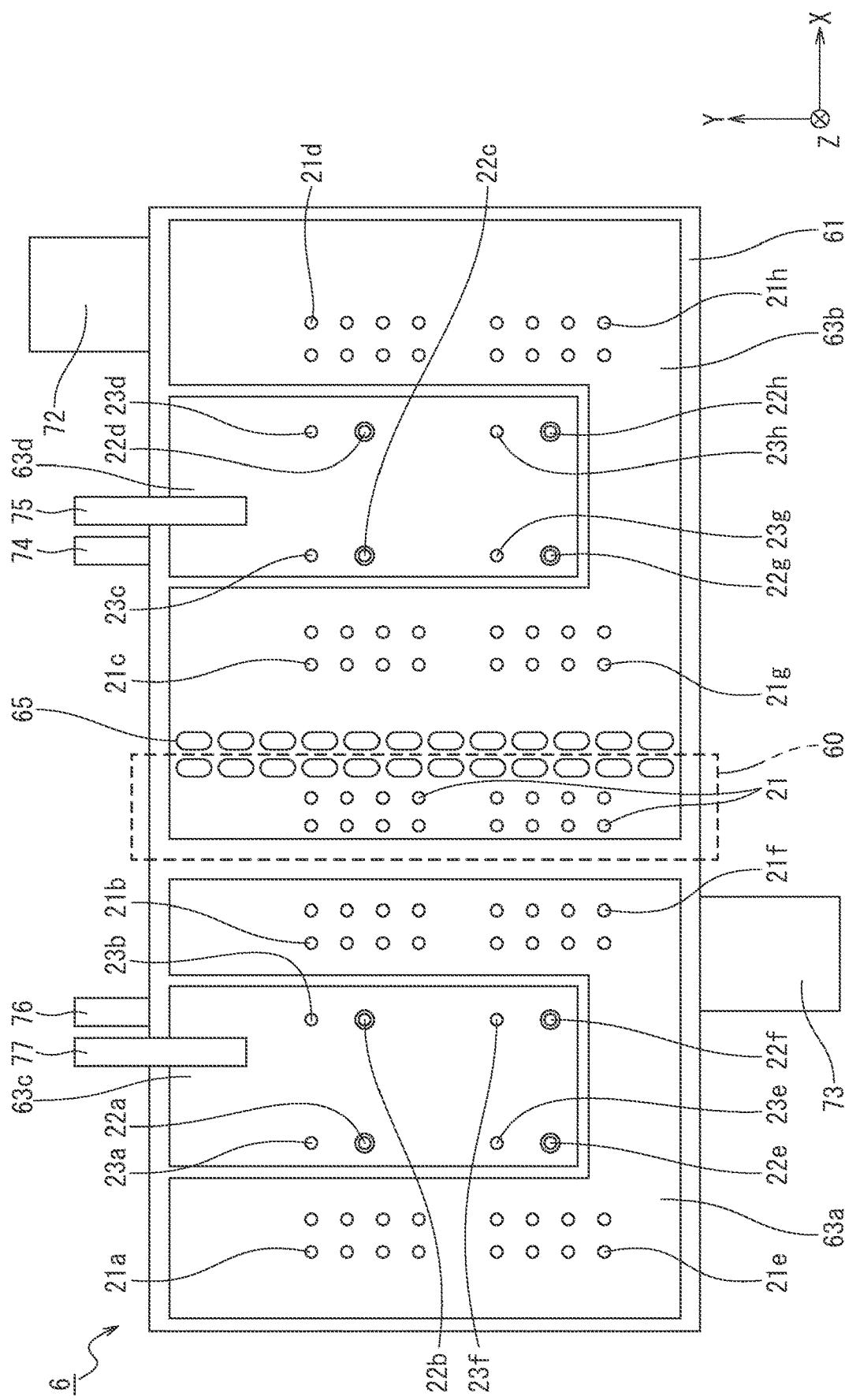
FIG. 11 is a plan view illustrating the printed circuit board according to the second embodiment as viewed from the bottom surface side.

A semiconductor device according to a second embodiment differs from the semiconductor device according to the first embodiment illustrated in FIG. 3 and FIG. 4 in being provided with sits 64 and 65 in the printed circuit board 6, as illustrated in FIG. 10 and FIG. 11. FIG. 10 is a plan view of the printed circuit board 6 as viewed from the top surface side, and FIG. 11 is a plan view of the printed circuit board 6 as viewed from the bottom surface side. As illustrated in FIG. 10, the upper-side wiring layer 62b of the printed circuit board 6 is provided with the slits 64. As illustrated in FIG. 11, the lower-side wiring layer 63b of the printed circuit board 6 is provided with the slits 65 at the positions corresponding to the slits 64. While FIG. 10 and FIG. 11 illustrate the case in which the respective slits 64 and 65 are provided in two columns, the respective slits 64 and 65 may be provided in a single column. The additional slits may be further provided at positions corresponding to the slits 64 and 65 in the insulating layer 61 interposed between the upper-side wiring layer 62b and the lower-side wiring layer 63b.

The other configurations of the semiconductor device according to the second embodiment are the same as those of the semiconductor device according to the first embodiment, and overlapping explanations are not repeated below. The semiconductor device according to the second embodiment can be manufactured by the same method of manufacturing the semiconductor device according to the first embodiment, excluding the process of providing the slits 64 and 65 in the printed circuit board 6.

The semiconductor device according to the second embodiment has the configuration contributing to the decrease in the wiring length and the current path so as to reduce the inductance, as in the case of the semiconductor device according to the first embodiment. In addition, providing the slits 64 and 65 in the printed circuit board 6 facilitates the process of curving the printed circuit board 6 at the position corresponding to the slits 64 and 65 upon the assembly of the semiconductor device according to the second embodiment, so as to facilitate the formation of the curved part 60.

Third Embodiment

Figure 12:
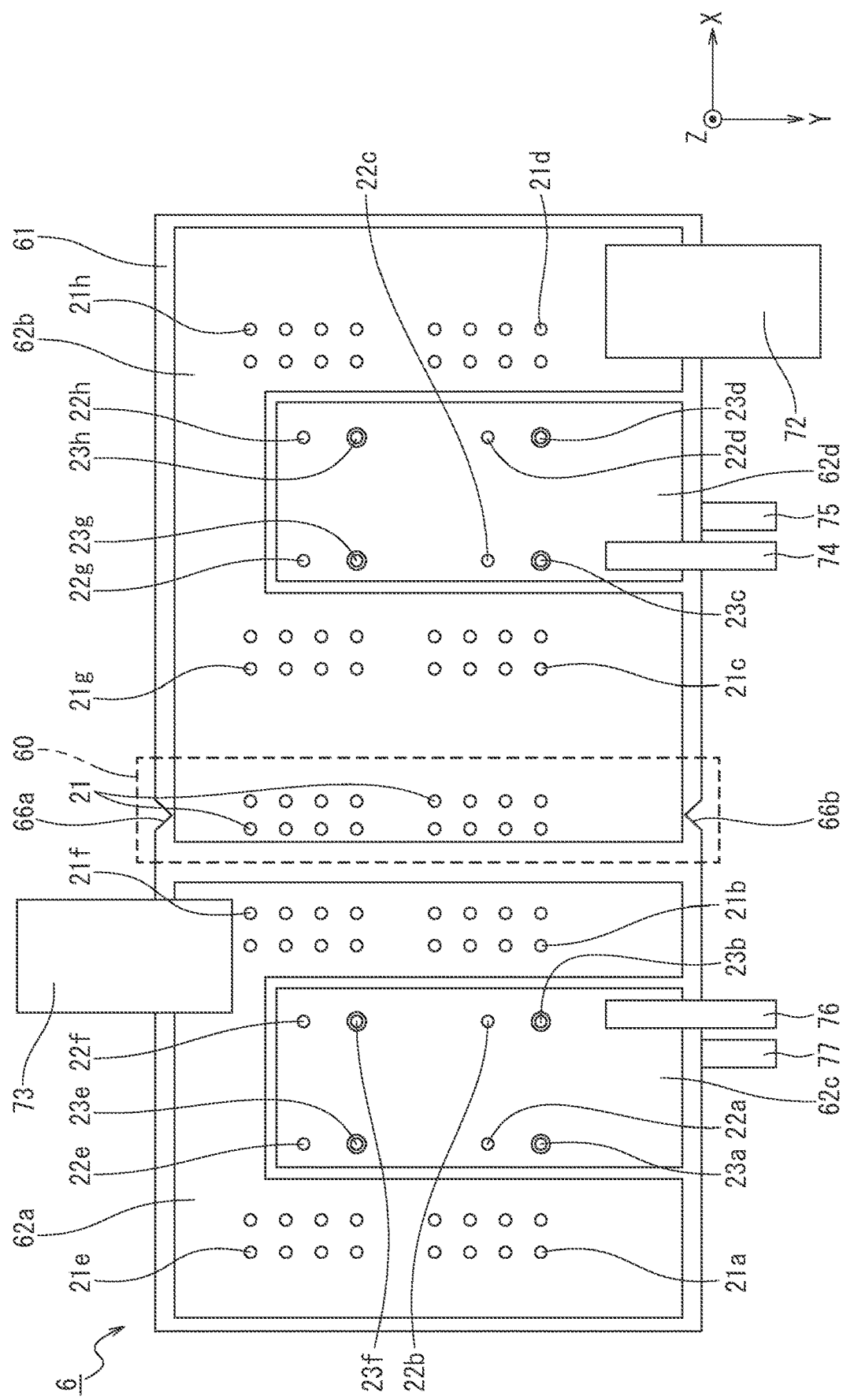
FIG. 12 is a plan view illustrating a printed circuit board according to a third embodiment as viewed from the top surface side.

A semiconductor device according to a third embodiment differs from the semiconductor device according to the first embodiment illustrated in FIG. 1 in being provided with notches 66a and 66b indicating a position at which the curved part 60 is formed in the insulating layer 61 of the printed circuit board 6, as illustrated in FIG. 12. The notches 66a and 66b indicating the position at which the curved part 60 is formed may be provided in the upper-side wiring layer 62b, instead of being provided in the insulating layer 61.

The other configurations of the semiconductor device according to the third embodiment are the same as those of the semiconductor device according to the first embodiment, and overlapping explanations are not repeated below. The semiconductor device according to the third embodiment can be manufactured by the same method of manufacturing the semiconductor device according to the first embodiment, excluding the process of providing the notches 66a and 66b in the insulating layer 61 of the printed circuit board 6.

The semiconductor device according to the third embodiment has the configuration contributing to the decrease in the wiring length and the current path so as to reduce the inductance, as in the case of the semiconductor device according to the first embodiment. In addition, providing the notches 66a and 66b indicating the position at which the curved part 60 is formed facilitates the positioning of the jig 9 for forming the curved part 60, for example, upon the assembly of the semiconductor device according to the third embodiment.

Other Embodiments

While the present invention has been illustrated by reference to the first to third embodiments, it should be understood that the present invention is not intended to be limited to the descriptions and the drawings composing part of this disclosure. It will be apparent to those skilled in the art that the present invention includes various alternative embodiments, examples, and technical applications according to the technical idea disclosed in the above embodiments.

For example, the configurations disclosed in the first to third embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. A semiconductor device comprising:
   an insulated circuit substrate including first and second conductive layers on a top surface side;
   a first semiconductor chip mounted on the first conductive layer;
   a second semiconductor chip mounted on the second conductive layer;
   a printed circuit board including an insulating layer, a first lower-side wiring layer arranged on one main surface of the insulating layer so as to be opposed to the first semiconductor chip, and a second lower-side wiring layer arranged on the one main surface of the insulating layer so as to be opposed to the second semiconductor chip, the printed circuit board being provided with a curved part curved toward the insulated circuit substrate;
   a first connection member arranged to connect the first semiconductor chip with the first lower-side wiring layer;
   a second connection member arranged to connect the second semiconductor chip with the second lower-side wiring layer;
   a third connection member arranged to connect the first conductive layer with the second lower-side wiring layer at the curved part; and
   a sealing member provided to seal the first and second semiconductor chips, the printed circuit board, and the first to third connection members.

2. The semiconductor device of claim 1, wherein the first to third connection members have heights common to each other.

3. The semiconductor device of claim 1, wherein the curved part has a step having a thickness common to a total thickness of the first semiconductor chip and a bonding material bonding the first semiconductor chip and the first conductive layer to each other.

4. The semiconductor device of claim 1, wherein the curved part is located in a middle part of the printed circuit board in a longitudinal direction.

5. The semiconductor device of claim 1, wherein the insulating layer is formed from resin.

6. The semiconductor device of claim 1, wherein the insulated circuit substrate includes a resin substrate having a top surface on which the first and second conductive layers are deposited.

7. The semiconductor device of claim 6, further comprising a first external connection terminal integrated with the second conductive layer and externally extending from the sealing member.

8. The semiconductor device of claim 1, wherein the first lower-side wiring layer is electrically connected to a main electrode of the first semiconductor chip, and
   the second lower-side wiring layer is electrically connected to a main electrode of the second semiconductor chip.

9. The semiconductor device of claim 1, wherein the printed circuit board includes:
   a first upper-side wiring layer deposited on a top surface of the insulating layer at a position overlapping with the first lower-side wiring layer via the insulating layer so as to be electrically connected to the first lower-side wiring layer; and
   a second upper-side wiring layer deposited on the top surface of the insulating layer at a position overlapping with the second lower-side wiring layer via the insulating layer so as to be electrically connected to the second lower-side wiring layer.

10. The semiconductor device of claim 9, further comprising a second external connection terminal connected to the first upper-side wiring layer.

11. The semiconductor device of claim 10, further comprising a third external connection terminal connected to the second upper-side wiring layer.

12. The semiconductor device of claim 9, wherein the printed circuit board includes:
    a third lower-side wiring layer deposited on a bottom surface of the insulating layer and electrically connected to a first main electrode of the first semiconductor chip; and
    a third upper-side wiring layer deposited on the top surface of the insulating layer at a position overlapping with the third lower-side wiring layer via the insulating layer so as to be electrically connected to a control electrode of the first semiconductor chip, and
    the third lower-side wiring layer and the third upper-side wiring layer have current paths opposite to each other.

13. The semiconductor device of claim 1, wherein the printed circuit board is provided with a slit at a position corresponding to the curved part.

14. The semiconductor device of claim 1, wherein the printed circuit board is provided with a notch at a position corresponding to the curved part.

* * * * *